United States Patent [19]

Mortensen

[11] Patent Number: 4,793,488

[45] Date of Patent: Dec. 27, 1988

[54] PACKAGE FOR SEMICONDUCTOR WAFERS

[75] Inventor: Barry L. Gregerson, Shorewood, Minn.

[73] Assignee: Empak, Inc., Chanhassen, Minn.

[21] Appl. No.: 70,435

[22] Filed: Jul. 7, 1987

[51] Int. Cl.[4] .............................................. B65D 85/48
[52] U.S. Cl. .................................... 206/454; 206/334; 206/449
[58] Field of Search ............... 206/328, 334, 454, 455, 206/444, 586, 508, 303, 449; 211/40, 41

[56] References Cited

U.S. PATENT DOCUMENTS

| | | | |
|---|---|---|---|
| 4,043,451 | 8/1977 | Johnson | 206/334 |
| 4,061,228 | 12/1977 | Johnson | 206/454 |
| 4,160,504 | 3/1979 | Kudlich et al. | 206/454 |
| 4,450,960 | 5/1984 | Johnson | 206/334 |
| 4,490,087 | 12/1984 | Ryan et al. | 206/454 |
| 4,520,925 | 6/1985 | Johnson | 206/334 |
| 4,555,024 | 11/1985 | Voss et al. | 206/334 |
| 4,557,382 | 12/1985 | Johnson | 206/444 |
| 4,588,086 | 5/1986 | Coe | 206/334 |
| 4,669,612 | 6/1987 | Mortensen | 206/334 |

*Primary Examiner*—David T. Fidei
*Attorney, Agent, or Firm*—Hugh D. Jaeger

[57] ABSTRACT

A sealable contamination proof container package bottom and top for storing and transporting a plurality of silicon wafers in a wafer carrier. The package bottom includes four sides, a continuous vertical surface for tape sealing surrounding the four sides, a lip positioned on a vertical edge, opposing hook latches on opposing sides, opposing hand grip recesses on the opposing sides and a raised bottom surface for package stacking. The package top includes four sides, a continuous vertical surface for tape sealing surrounding the four sides, a lip positioned on the vertical surface, opposing hook catches on the opposing side, a top surface with a raised stacking surface, a plurality of transparent inspection windows on the top surface, and two rows of wafer springs positioned on the underside of the top surface. The package top and bottom halves provide that a carrier mates between the package top and package bottom with the wafers in the carrier. The package top and bottom mate with the upper lip engaged against the lower lip, and the catches of the top engage with the latches of the bottom. In opening, the top package half is moved in a direction coinciding to the plane of the wafers with respect to positioning of the catches and latches on the package side. The raised top portion of the top package half and the recessed bottom of the bottom package half provides for stacking of like packages.

1 Claim, 13 Drawing Sheets

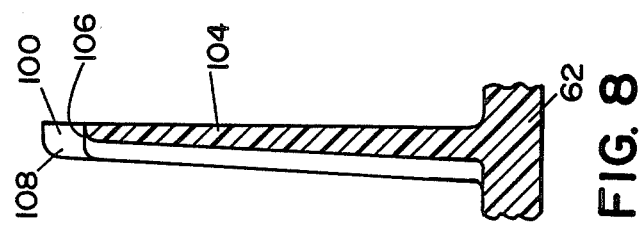
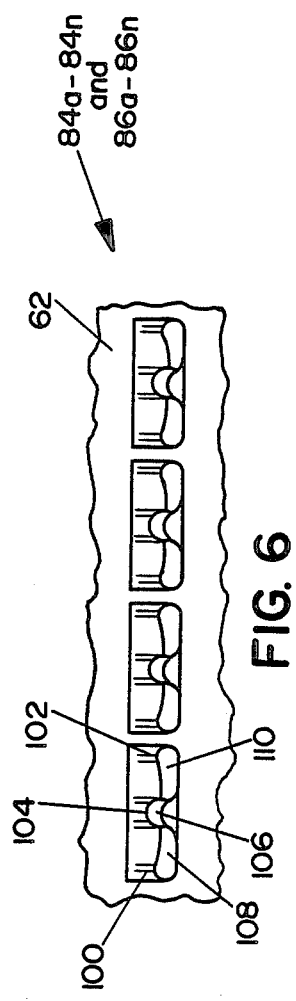
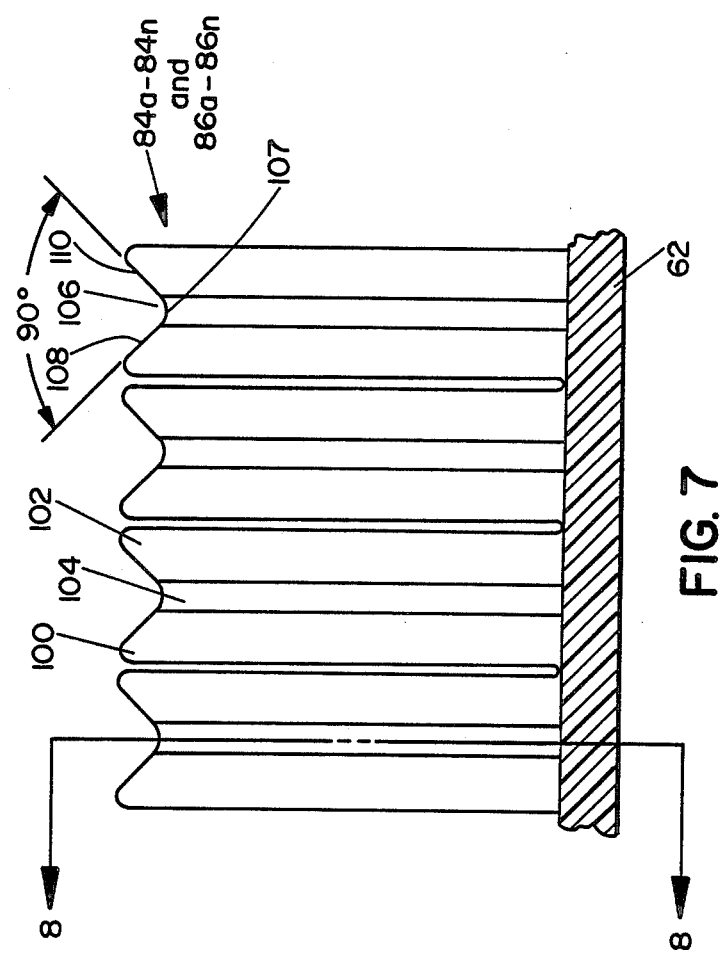

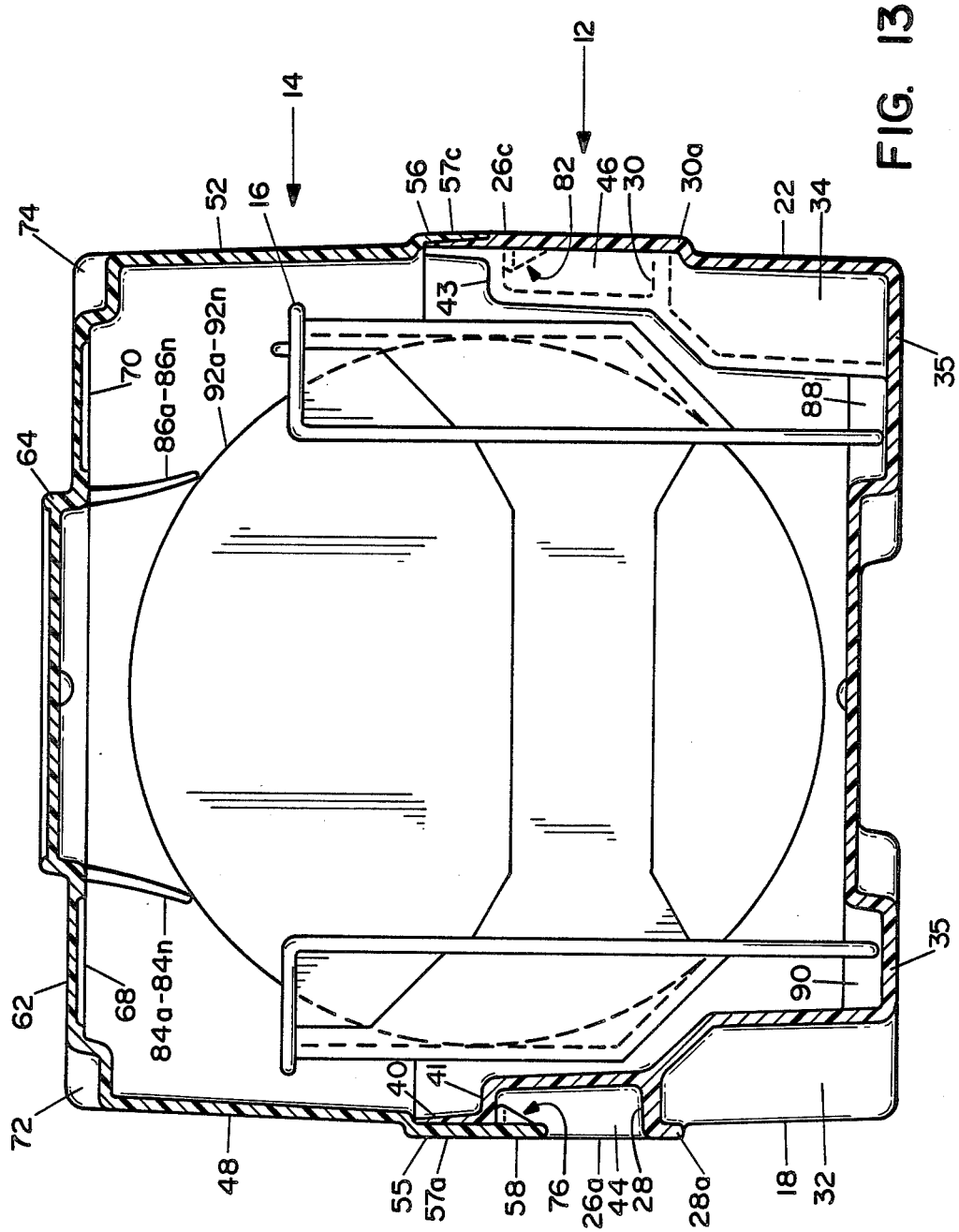

PRESENT INVENTION
CATCHES AND LATCHES ON SIDE
(END VIEW)

CATCHES AND LATCHES ON END
(SIDE VIEW)

4,793,488

PACKAGE FOR SEMICONDUCTOR WAFERS

BACKGROUND OF THE INVENTION

1. Field of the Invention

The present invention pertains to a package, and more particularly, pertains to a two-part package for the storing and transporting of semiconductor wafers.

2. Description of the Prior Art

Prior art packages have usually lifted from the end as illustrated in FIG. 14A or 14B. This end lifting has caused stress and strain on the end wafers, and sometimes causes breakage as the top slides against the plane of one or more wafers. Further, most prior art packages have opened from the ends, rather than opening from the sides, which results in the spring tension on the last tooth and then on the last semiconductor wafer or wafers.

The present invention overcomes the disadvantages of the prior art by providing a package which openes on the side.

SUMMARY OF THE INVENTION

The general purpose of the present invention is to provide a wafer package which opens from the sides and evenly relieves tension of the wafer springs against the semiconductor wafers or like articles.

According to one embodiment of the present invention, there is provided a sealable contamination proof semiconductor wafer package, including a bottom and a top. The bottom includes four sides, a continuous vertical surface for tape sealing; and surrounding the four sides, a lip positioned on a vertical edge, opposing hook latches, opposing hand grip recesses on the opposing sides and a raised bottom surface for stacking of a plurality of packages. The top includes four sides, continuous vertical surface for tape sealing; and surrounding the four sides, a lip positioned on the vertical surface, opposing hook catches, a top surface with a raised stacking surface, a plurality of transport inspection windows on the top surface, and rows of wafer springs positioned on the underside of the top surface.

Significant aspects and features of the present invention include a semiconductor wafer package which opens from the sides, which thereby equally relieves spring tension on the wafers. The handle is located under the lock assembly. The top of the package has a see-through window when a polypropolene material is used. The inside of the package has no ribs which provides for easy washability, but yet is rigid accordingly. The perimeter of the package is tapable, and further seals the locks. The locks are of such a configuration as to allow a plurality of fingers to disengage the lock. The package provides that the customer's name can be imprinted thereupon. The package is also aesthetically pleasing by the formation of the surfaces of the package. Finally, the bottom and the top of the package engage with respect to other like packages for stacking purposes.

Having thus described the embodiments of the present invention, it is a principal object hereof to provide a wafer package for transporting and storing of semiconductor wafers.

Objects of the present invention include a high technology state-of-the-art wafer package for storing and transporting semiconductor wafers which unlocks and opens from either side.

Other objects of the present invention include a package which will accommodate four inch wafers, six inch wafers, five inch wafers, three inch wafers, and eight inch wafers. The principal object of the present invention are also applicable to any other type of carrier which would carry semiconductor or mask plates where the springs would be modified accordingly to accommodate such types of wafers or masks.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 6 illustrates a top view of the wafer contactors;

FIG. 7 illustrates a side view of a typical wafer contactor;

FIG. 8 illustrates a cross-sectional view of wafer contactors taken along line 8—8 of FIG. 7;

FIG. 13 illustrates a cross-sectional end view of the top and bottom engaged with each other and a wafer therebetween;

DESCRIPTION OF THE PREFERRED EMBODIMENTS

Figure 1:
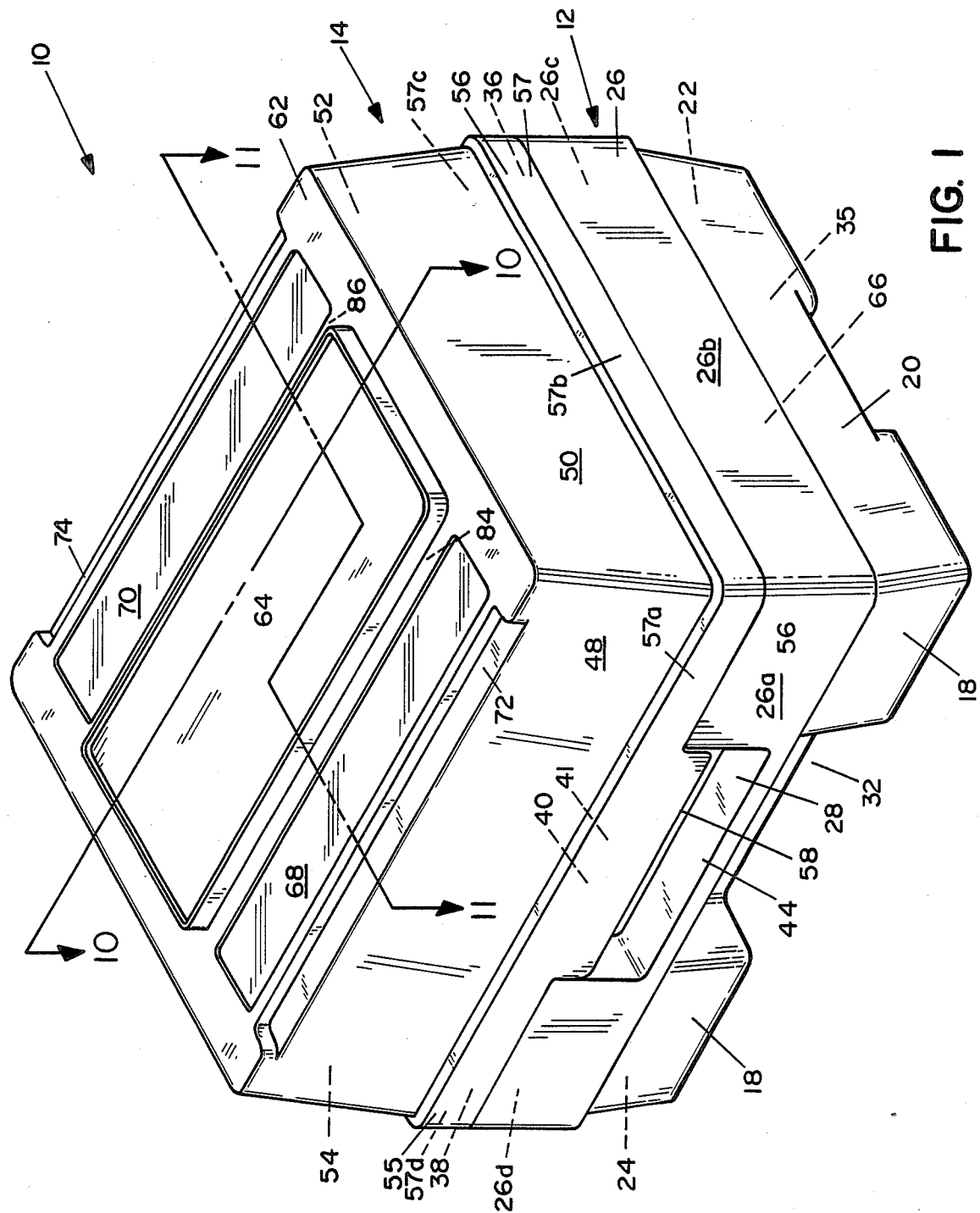
FIG. 1 illustrates a perspective view of a wafer package, the present invention, including a top and bottom.
Figure 2:
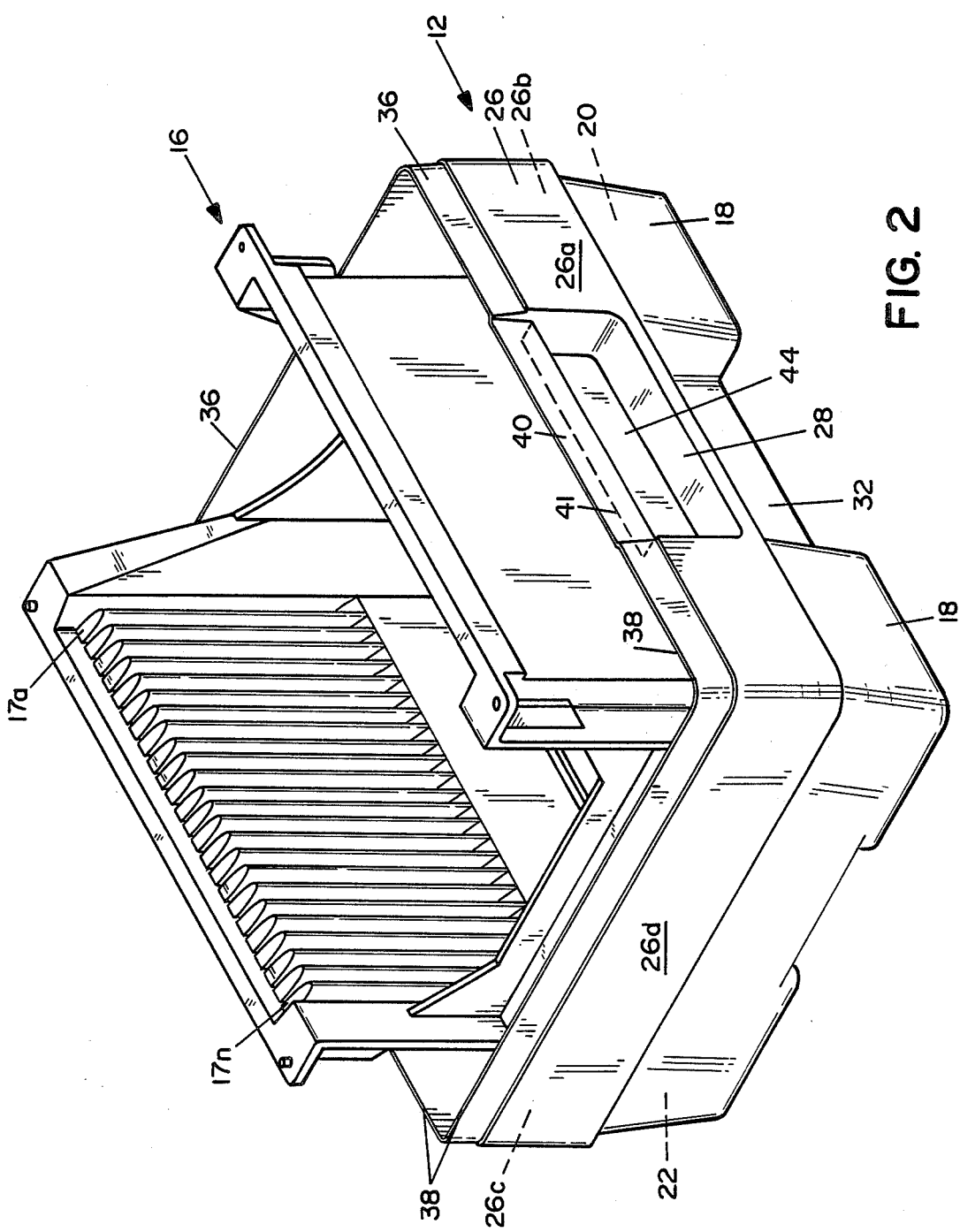
FIG. 2 illustrates a perspective view of the package bottom with a wafer carrier therein.
Figure 9:
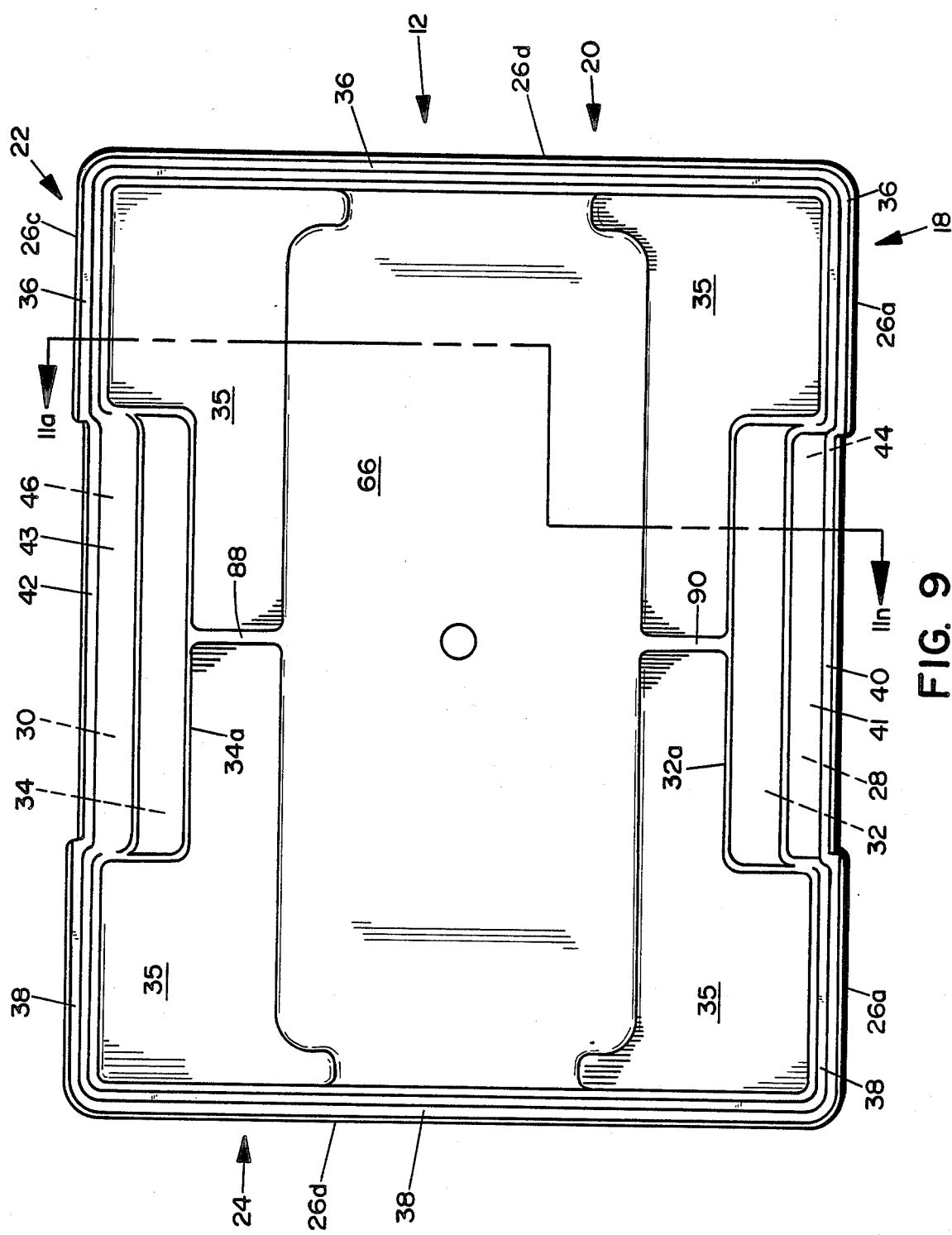
FIG. 9 illustrates a top view of the package bottom.
Figure 11:
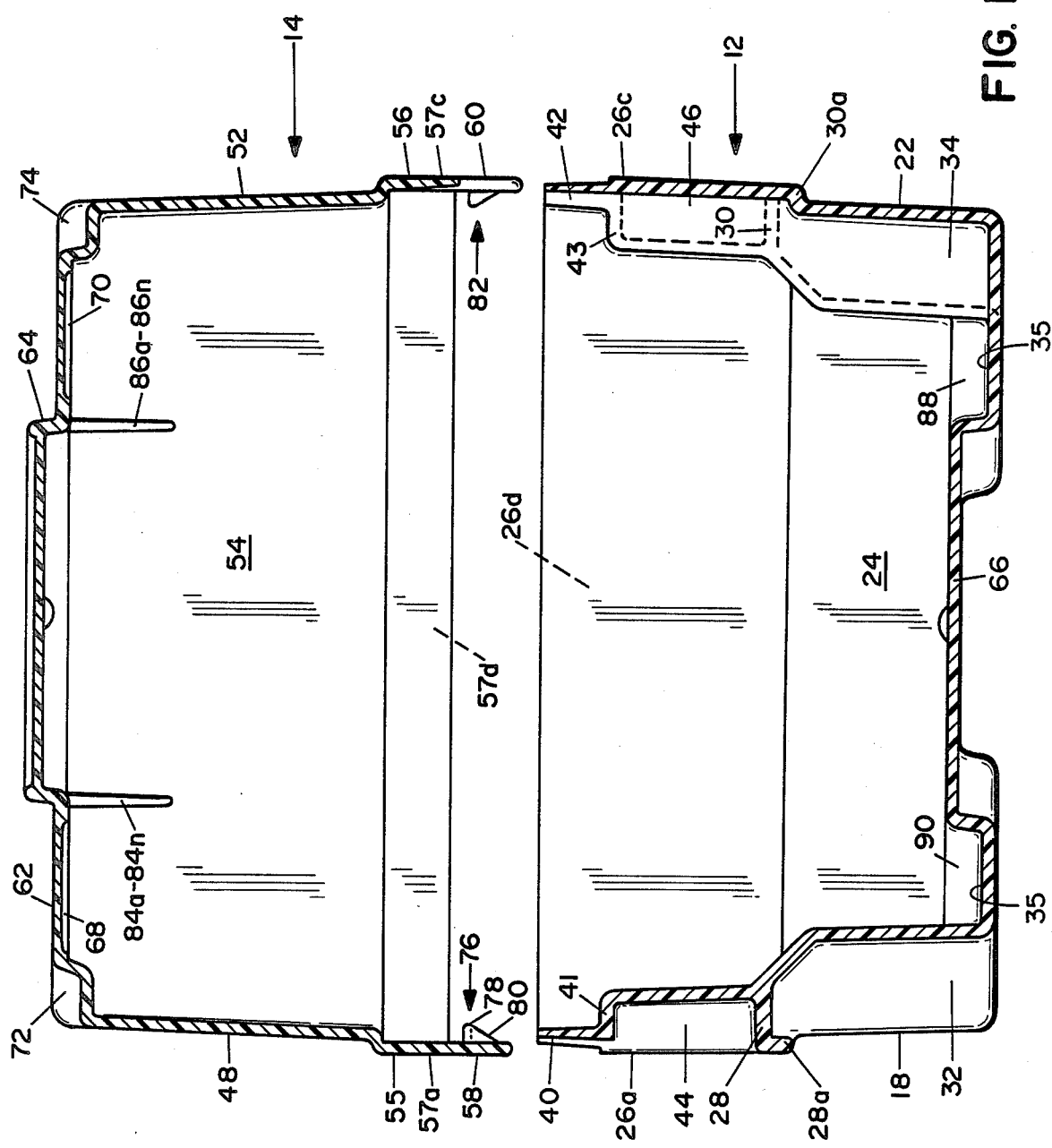
FIG. 11 illustrates a cross-sectional end view of the package top and bottom prior to engagement with each other.

FIG. 1 illustrates a perspective view of a package 10, the present invention, for the storage and transportation of silicon wafers in a wafer carrier. The package includes a bottom member 12 and a top member 14 engaged to contain a wafer carrier 16 which is illustrated in FIG. 2. The bottom member 12 includes sides 18, 20, 22, and 24; a continuous vertical member 26 for taping including planar surfaces 26a, 26b, 26c and 26d with rounded vertical corners therebetween; handles 28 and 30 with handle reinforcement members 28a and 30a as illustrated in FIG. 11; a handle recess 32 located beneath handle 28 and in the side 18; and, a similar recess 34 located beneath handle 30 in the opposing side 22. The handle 30 and the handle recess 34 are also illustrated in FIGS. 11 and 13. U-shaped lip members 36 and 38, as illustrated in FIGS. 2 and 9, locate at the upper portion of the continuous vertical member 26 to mate with a corresponding lip in the top member 14 as later described in detail. Latch side members 40 and 42, and latch members 41 and 43 locate between the ends of the u-shaped lip members 36 and 38 as illustrated in FIGS. 2 and 9. A catch recess 44, for accommodation of a catch on the top member 14, locates above the handle 28 and in the planar surface 26a wherein the catch is later described in detail. The catch recesses 44 and 46 are designed to be able to insert a plurality of fingers into the same to digitally disengage the catch from the latch where the elements of which are described later in detail. A similar catch recess 46, for accommodation of another catch on the top member 14, locates above handle 30 and in the planar surface 26c as ilustrated in FIG. 9 and later described in detail. A planar bottom 35 locates between the lower portions of sides 18-24, and includes a rectangular recessed member 66.

Figure 3:
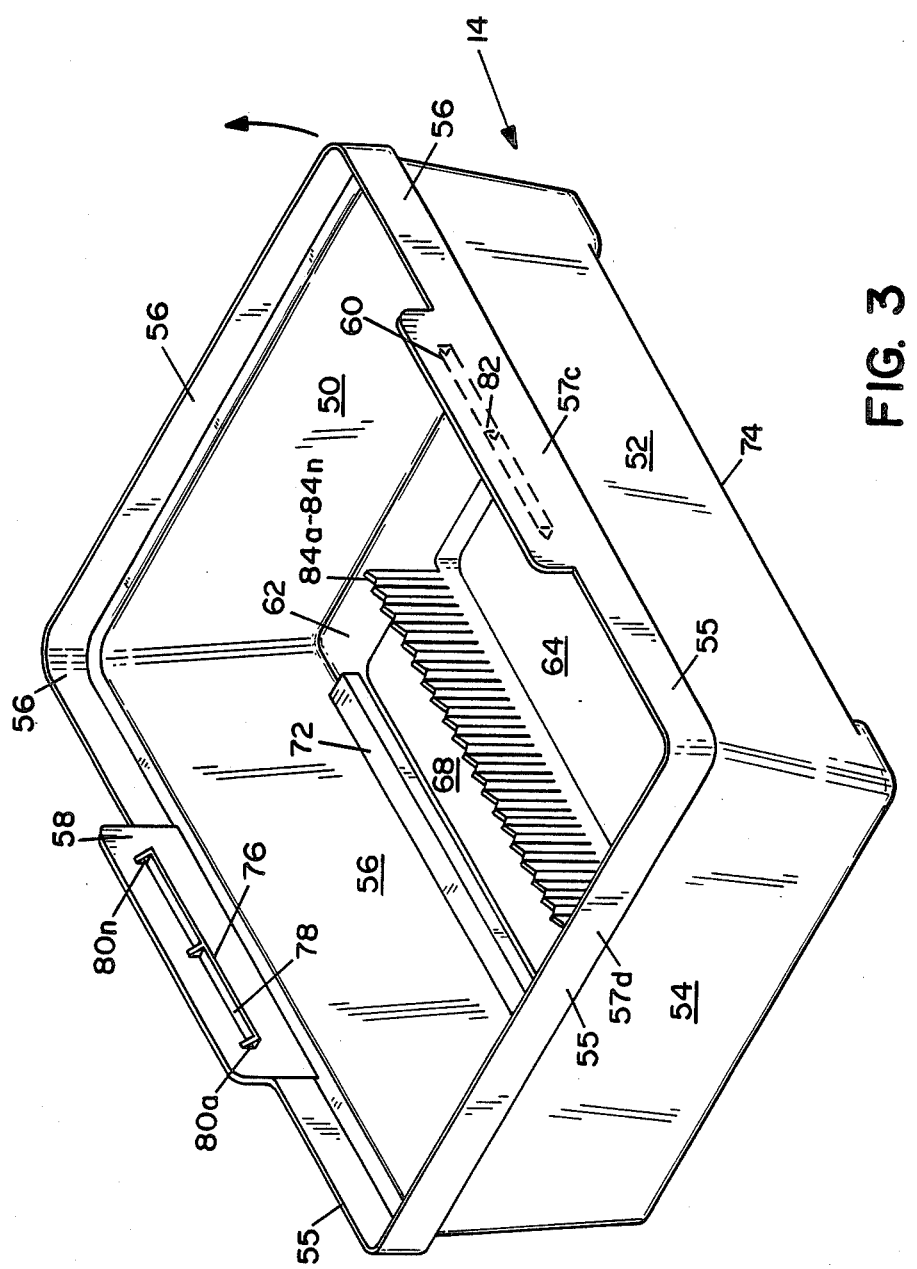
FIG. 3 illustrates a perspective view of the interior of the top.

The external portions of the top member 14 include sides 48, 50, 52 and 54; vertical u-shaped lip members 55 and 56 for mating with u-shaped lip members 36 and 38 of the bottom member 12; a continuous vertical member 57 including planar surfaces 57a, 57b, 57c and 57d for taping with rounded vertical corners therebetween. A catch tab 58 locates as a part of the planar surface 57a between the ends of the u-shaped lip members 55 and 56, and a corresponding similar catch tab 60 locates on planar surface 56c between the ends of the u-shaped lip members 55 and 56, as also illustrated in FIG. 3. The top member 14 also includes a planar top surface 62, and a raised positioning member 64 for mating and stacking of like packages with a corresponding recessed member 66, as illustrated in FIG. 13, which is located raised from the planar bottom 35 of the bottom member 12. Thin rectangular shaped elements 68 and 70 locate adjacent and parallel to the raised positioning member 64. The package 10 can be molded of several types of plastic including colored plastic, opaque or clear plastic. If opaque or clear plastics are used, the rectangular shaped elements present transparent viewing surfaces which are used as inspection ports to view the contents of the package 10. Configured edge strengtheners 72 and 74 locate parallel to the thin rectangular elements 68 and 70, and on the edges of the top member 14 between the planar top surface 62 and each of the sides 52 and 56 to impart structural integrity to the top member 14.

FIG. 2 illustrates a perspective view of the package bottom member 12 with a wafer carrier 16 contained therein where all numerals correspond to those elements previously described. Illustrated in particular is the positioning of the latch side member 40 between the ends of the u-shaped lip members 36 and 38 above the catch recess 44 and above the handle 28.

Figure 5:
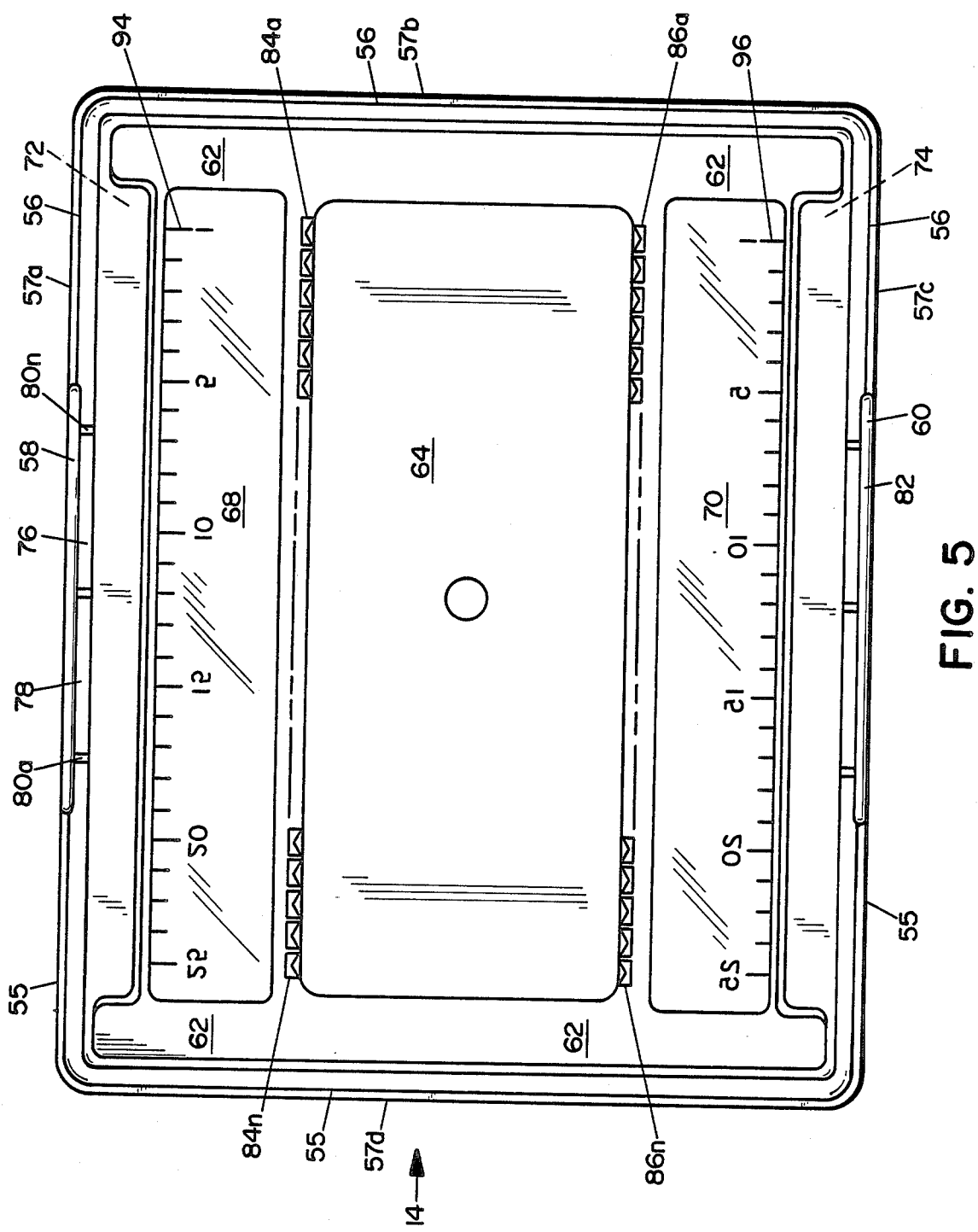
FIG. 5 illustrates a bottom view of the package top.

FIG. 3 illustrates a perspective view of the interior of the top member 14 where all numerals correspond to those elements previously described. A catch 76 positions on the inner surface of the catch tab 58. The catch 76 includes an elongated catch bar 78 with reinforcement gussets 80a-80n. A similar mirror image like catch 82 positions with like elements on the inner surface of the opposite catch tab 60. The catches 76 and 82 utilize the spring constant factor inherent qualities of the catch tab 58 and catch tab 60, respectively, to engage beneath latch side members 40 and 42 for securing the top member 12 to the package bottom member 12 thereby forming the package 10. A row of flexible wafer contactors 84a-84n are illustrated as being positioned perpendicularly to the planar top surface 62 and adjacent to the raised positioning member 64. FIG. 5 also illustrates the same row of wafer contactors 84a-84n, and an additional row of wafer contactors 86a-86n parallel to each other protruding perpendicularly from the under surface of top member 14.

Figure 4:
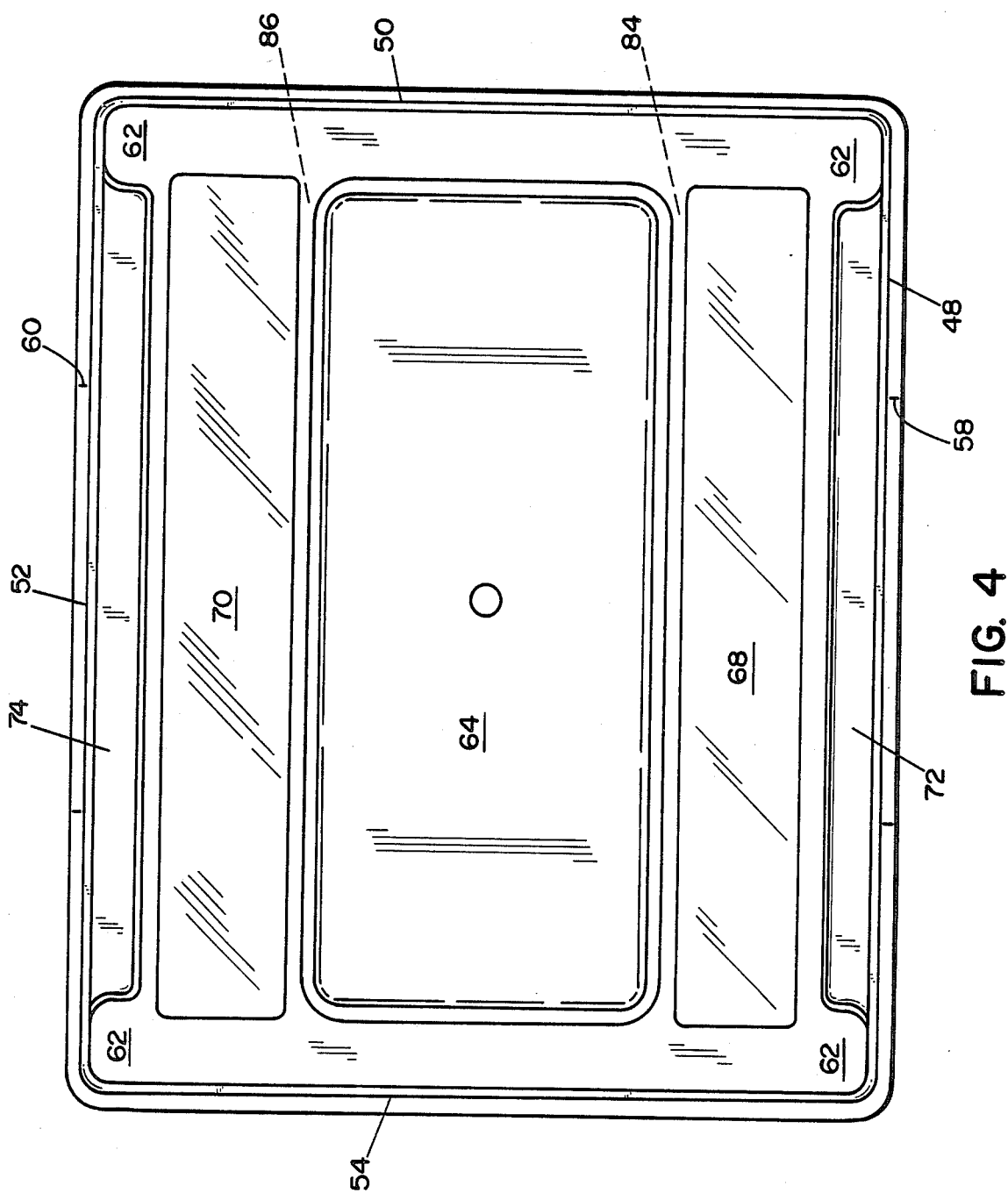
FIG. 4 illustrates a top view of the package top.

FIG. 4 illustrates a top view of the package top member 14 where all numerals correspond to those elements previously described. Rectangular elements 68 and 70 are thin in profile and may be transparent, opaque or nontransparent depending upon the polymer material used to mold the package 10. The rectangular elements 68 and 70 can be used as viewing ports for inspection of the contents of the package 10 when the viewing ports are constructed of a transparent material.

FIG. 5 illustrates a bottom view of the top member 14 where transparent plastic is incorporated and where all numerals correspond to those elements previously described. Raised content numbering scales 94 and 96 are located on the upper surface of the thin rectangular elements 68 and 70. The rows of wafer contactors 84a-84n and 86a-86n are adjacent to the raised positioning member 64. A detailed description of the wafer contactors is found in FIGS. 6, 7, and 8.

FIG. 6 illustrates a top view of the wafer contactors 84a-84n and 86a-86n where all numerals correspond to those elements previously described. It is noted that the profile increases nearest the planar top surface 62.

FIG. 7 illustrates a side view of a typical wafer contactor 84a-84n and 86a-86n where all numerals correspond to those elements previously described. Each contactor includes two flexible members 100 and 102 extending perpendicular from the planar top surface 62, and includes a thin member 104 between the flexible members 100 and 102. A substantially 90° angle "V" 106, for aiding in contact with the wafers, positions as illustrated, having its vertex located in a center portion 107 of the thin member 104, having ramped legs or sides 108 and 110 positioned adjacent to the vertex 107, and lying upon biased surfaces of the upright flexible members 100 and 102.

FIG. 8 illustrates a cross-sectional view of the wafer contactors 84 and 86 taken along line 8—8 of FIG. 7. It is particularly noted that the cross-sectional area is reduced as the contactor members 100-104 proceed from near the planar surface 62 to the tip area containing the "V" 106 to provide for maximum flexibility near the "V" wafer contact area.

FIG. 9 illustrates a top view of the package bottom member 12 where all numerals correspond to those elements previously described. The recessed member 66 corresponding in shape to the raised positioning member 64 in the top member 14 rises upwardly and above the planar bottom 35 of the bottom member 12. Raised support struts 88 and 90 position between the recessed member 66 and the walls 34a and 32a of the handle recesses 34 and 32, lending support to the handle recesses 32 and 34 and also to the recessed member 66.

Figure 10:
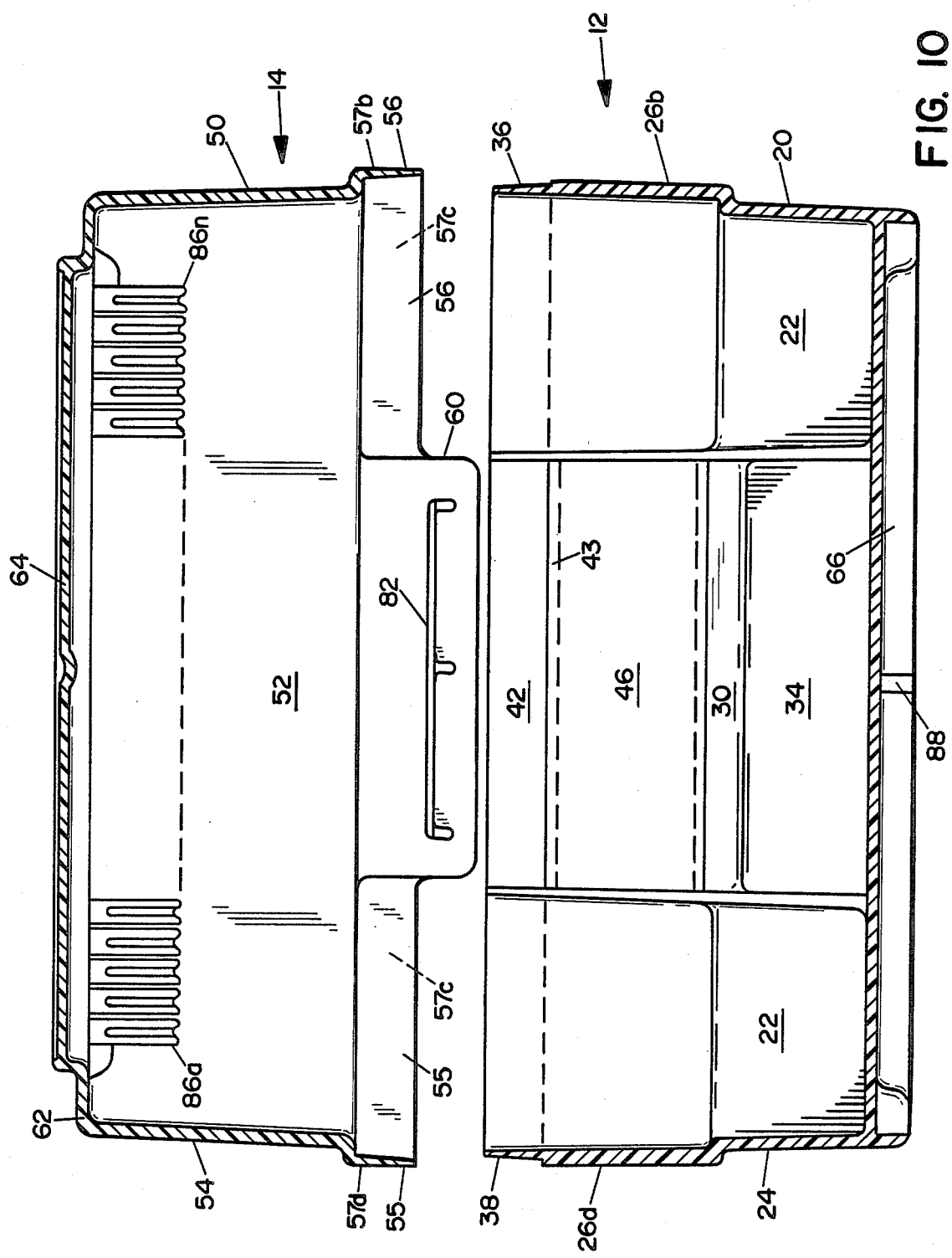
FIG. 10 illustrates a cross-sectional side view of the bottom and top of the package prior to engagement with each other.

FIG. 10 illustrates a cross-sectional view of the bottom and top elements of the package 10 prior to engagement, taken vertically through the center and along its longitudinal axis along line 10—10 of FIG. 1, where all numerals correspond to those elements previously described.

FIG. 11 illustrates an end view cross-section of the package 10 prior to engagement of the package top member 14 with the package bottom member 12 taken along line 11—11 of FIG. 1. Line 11a—11a in FIG. 9 indicates a similar cross-sectional portion to that indicated by line 11—11 of FIG. 1. All numerals correspond to those elements previously described.

MODE OF OPERATION

Figure 12:
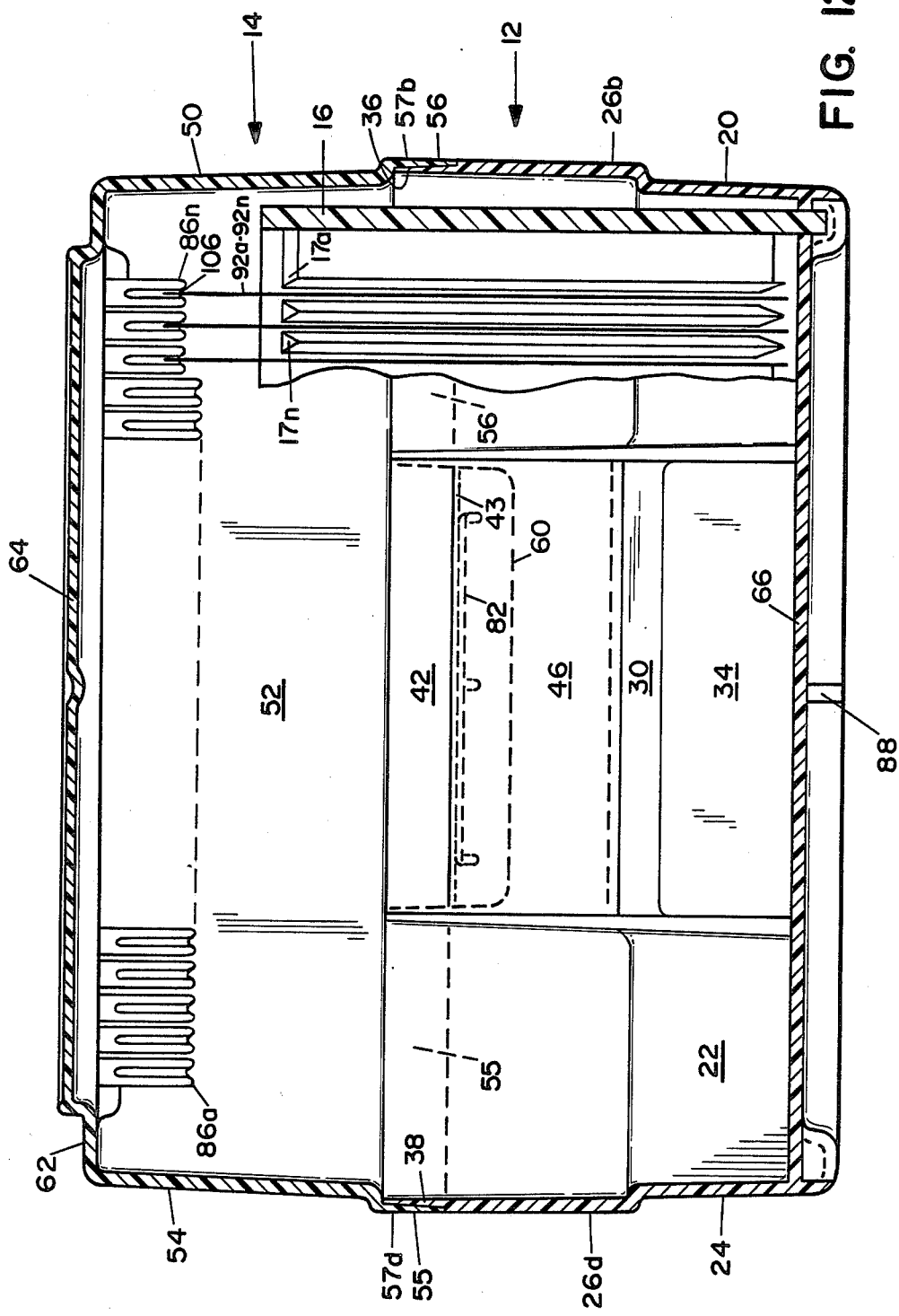
FIG. 12 illustrates a cross-sectional side view of the top and bottom engaged with each other.

FIGS. 12 and 13 best illustrate the mode of operation of the package 10 where the top member 14 engages over and about a plurality of wafers 92a-92n in a wafer carrier 16 positioned in a package bottom member 12.

FIG. 12 illustrates a cross-sectional view of top and bottom members 14 and 12 as illustrated in FIG. 10 engaged one with the other where all numerals correspond to those elements previously described. The catch 82 is illustrated frictionally engaged with the latch member 43.

FIG. 13 illustrates the cross sections of the top and bottom members 14 and 12, as illustrated in FIG. 11, engaged one with the other where all numerals correspond to those elements previously described. The catches 76 and 82 are illustrated frictionally engaged with latch members 41 and 43. The wafer carrier 16 and a plurality of wafers 92a-92n are illustrated encased within the top and bottom members 12 and 14 of the package 10. The wafer contactors 84a-84n and 86a-86n spring gently against a point on the circumference of each of the wafers 92a-92n to insure seating of the wafers 92a-92n within the carrier 10 and to minimize movement of the wafers in the carrier. Pressure against the wafers from the wafer contactors 84 and 86 also transmit through the wafers to the wafer carrier 16 to position and keep the wafer carrier 16 positioned firmly in the package.

Particularly illustrated in the drawings is the interlocking and interengaging relationship of the carrier 10 with respect to the package top member 14 and the package bottom member 12 with the plurality of wafers 92a-92n engaged therebetween the wafer carrier 16, the package top member 14 and the package bottom 12. The plurality of wafers 92a-92n are engaged between the plurality of teeth 17a-17n of the respective divider members and the opposing longitudinal members of the wafer carrier 16 which limits any defined movement so that each wafer is in the center of each pair of divider teeth members.

The wafer carrier 16, including the wafers 92a-92n is first placed on the planar bottom 35 of the package bottom member 12. The package top member 14 is positioned over the wafer carrier 16 containing the wafers 92a-92n and the bottom member 12. The vertical u-shaped lip members 55 and 56 of the top member 14 position over the u-shaped lip members 38 and 36, respectively, as illustrated in FIG. 12 and also illustrated in FIG. 1. Prior to engagement of the vertical u-shaped lip members 55 and 56 with u-shaped lip members 38 and 36, the catch tabs 58 and 60 engage against the latch side members 40 and 42, respectively, as the wafer contactors 84a-84n and 86a-86n come into contact with the wafers 92a-92n contained in the wafer carrier 16. The package top member 12 is positioned incorporating slightly more downward pressure against the wafers 92a-92n by the wafer contactors 84a-84n and 86a-86n which move outwardly as illustrated in this figure until the catches 76 and 82 engage with latch members 41 and 43 as the package top member 14 centers over the wafers 92a-92n. The upper portion of the wafers 92a-92n locate within the "V" 106 of each of the wafer contactors 84a-84n and 86a-86n to assist in uniform lateral spacing of the upper portions of the wafers with respect to each other. The wafers 92a-92n are held in the wafer carrier 16 and between the teeth thereof by the teeth 17a-17n of the wafer carrier 16 and the spring pressure exerted against the wafers by the wafer contactors 84a-84n and 86a-86n. The spring action secures the wafers within the carrier and also provides an upward pressure towards the package top with respect to the package bottom so that when the catches and latches are disengaged from each other the package top member 14 is sprung upward by the action of the wafer contactors against the wafers.

It is noted that the wafer carrier 16, as well as the top member 14, can be placed with either of its ends adjacent to either end of the package bottom member 12.

The upper lips engage about the lower lips and the latches with the catches, and the interengaging relationship between the carrier, the package bottom and the package top about the wafers occurs during engagement. This interengaging relationship particularly reflects that the package is a synergistic combination which reduces and eliminates contamination of the wafers, as well as providing for storage and transportation of the wafers and providing a flush perimeter for taping of the package top and bottom members 14 and 12, respectively, providing for secured shipping and storage. It is noted that the top member 14 aligns loosely to the bottom member 12 before the wafer contactor members align the wafers in the carrier on the center line of the carrier teeth 17a-n.

It is particularly important to note that the latches are flush, providing that the container is suitable not only of being taped but shrink-wrapped, some suitable type of polyester, polyethylene or mylar film, further providing a non-contaminate, closed container with strucural integrity. This also reduces the cost of the container and maintains structural integrity of the wafers supported therein. The carrier with respect to the package top and package bottom engages with the respective components so that the wafers are in frictional engagement with the entire package.

FIGS. 14A-14D illustrate simplified drawings of the package 10 and a generic prior art style package 120 where all numerals correspond to those elements previously described. The generic package 120 includes a top 122 and a bottom 124 including a catch/latch system on each end. Often wafers in prior art packages suffered breakage upon careless top removal wherein one catch/latch pair on an end was disengaged from one another and moved upwardly as in FIG. 14A upon which the catch/latch pair on the opposing end disengaged inadvertently or advertently whereupon the top slid or displaced as in FIG. 14B to exert undue sideways pressure across and against the plane of the wafer and causing breakage of one or more of the wafers in the package bottom 124. The package 10, the present invention, features catches and latches on the sides as previously described which greatly reduce the possibility of inadvertent wafer breakage upon inattentive package opening.

Figure 14C:
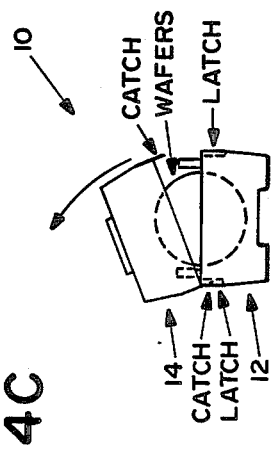
FIG. 14A-D illustrate simplified drawings of the package 10 and a generic prior art style package; and, FIG. 15 illustrates a side view of like packages stacked one upon another.
Figure 14D:
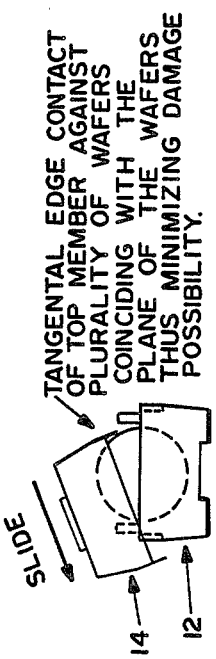
Figure 14A:
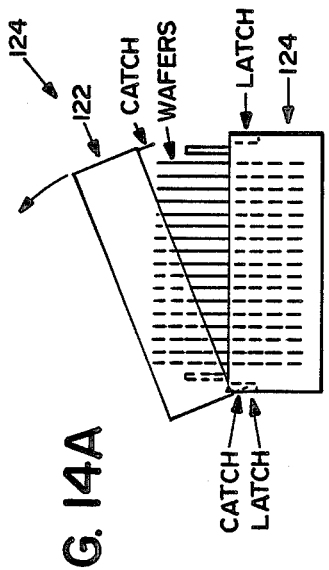
Figure 14B:
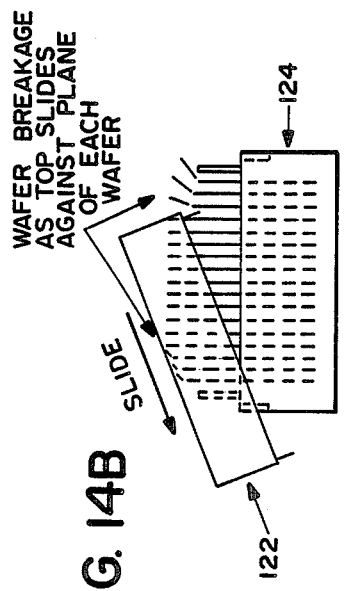

FIG. 14C illustrates an inattentive present invention package 10 opening whereby the catch and latch on the right side of the illustration are disengaged from each other and the catch and latch on the opposing side is disengaged in an inattentive fashion as illustrated in FIG. 14D whereby the top member 12 slides or displaces inadvertently against the plurality of wafers contacting them in a tangential sideways fashion causing stress coinciding only with the plane of the wafers and minimizing the threat of damage to the wafers.

Figure 15:
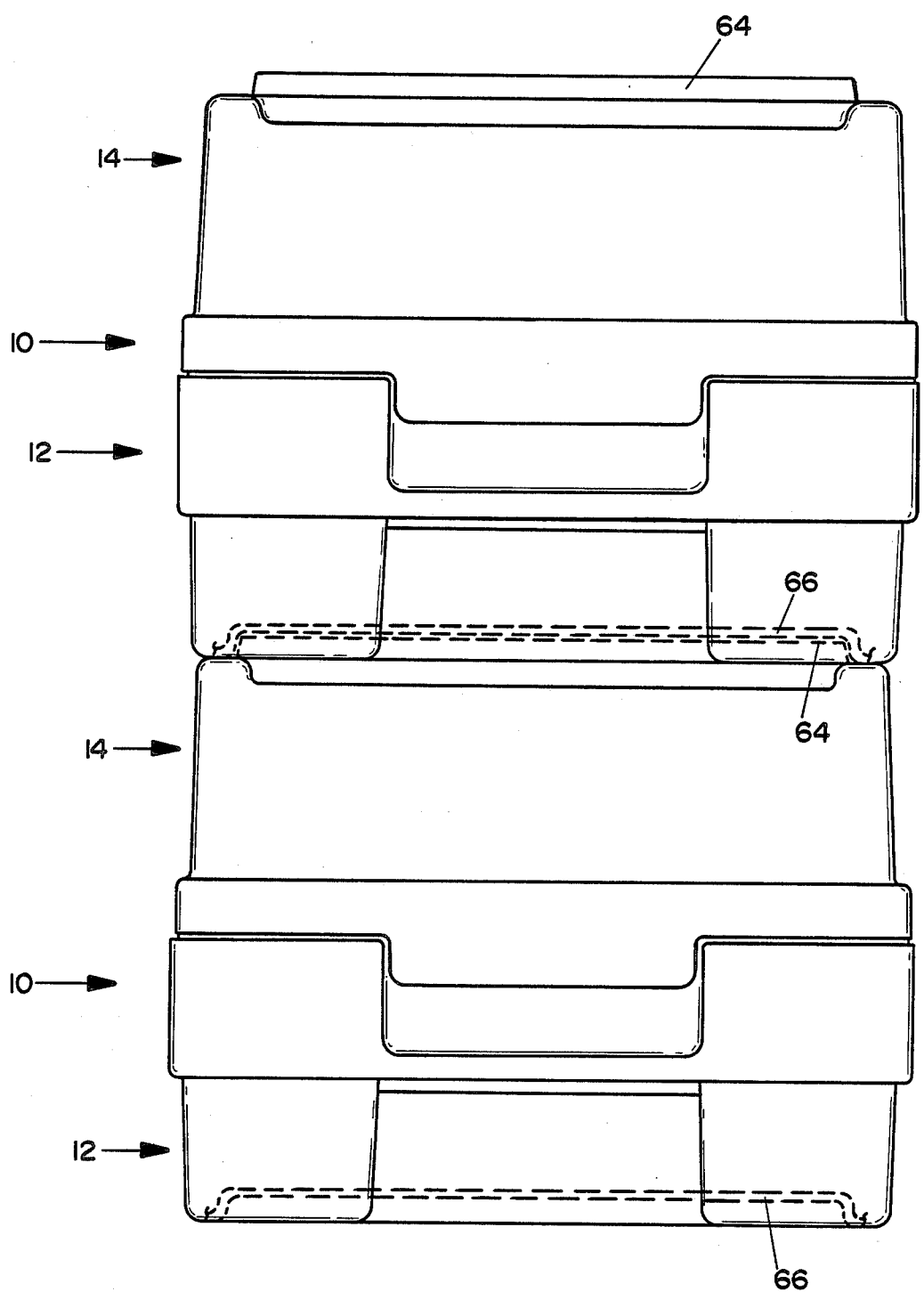

FIG. 15 illustrates a side view of like packages 10 stacked on upon another where all numerals correspond to those elements previously described. Like packages can be stacked by engagement of the recessed member 66 of the package bottom member 12 with the raised positioning member 64 of the package top member 14 of another package 10.

Various modifications can be made to the present invention without departing from the apparent scope thereof. Other articles could be packaged such as mask plates. The springs can then be modified accordingly.

We claim:

1. A sealable contamination proof container including package bottom and package top members for storing and transporting a plurality of semiconductor wafers or like articles in a semiconductor wafer carrier comprising:

a. a package bottom including four sides, a substantially planar bottom, a continuous vertical member for tape sealing and surrounding above said four sides, a package bottom indented lip positioned on said continuous vertical member, opposing latches on said opposing longitudinal vertical members, opposing indented handle areas at a mid portion of said longitudinal vertical members for accepting fingers of an individual hand, opposing catch recesses on said opposing longitudinal vertical members and above said handle area and a raised surface in said planar bottom for package stacking; and, b. a package top including four sides, a substantially planar top, a continuous vertical package top lip for tape sealing and surrounding said four sides and for engaging about said package bottom lip in providing a flush perimeter about said top and bottom lips and said vertical members and said sides, opposing hook catches on said opposing longitudinal sides for engaging over said latches providing for said package top to move in a direction coinciding to the vertical plane of said wafers and with respect to said catches and said latches, a top surface with raised stacking surface, and two rows of spaced opposing wafer contactors on an underside of said planar top, each of said contactor including two flexible members and a thin member therebetween said flexible member with a "V" formed therebetween for engaging with a wafer, the vertex of said "V" located on center of said thin member, ramped legs adjacent to said vertex and upon biased surfaces of said flexible members whereby said package top and bottom halves provide that a semiconductor wafer carrier with a plurality of wafers mates between said package top and said package bottom with said wafers in said carrier and said package top rotates about said package bottom and about the plane of said semiconductor wafers during opening and closing.

* * * * *